(12) United States Patent
Chen et al.

(10) Patent No.: US 8,430,615 B2
(45) Date of Patent: Apr. 30, 2013

(54) SECURING STRUCTURE WITH URGED FASTENER

(75) Inventors: Yen-Chih Chen, Taipei Hsien (TW); Chien-Yu Chao, Taipei Hsien (TW)

(73) Assignee: Foxconn Technology Co., Ltd., New Taipei (TW)

( * ) Notice: Subject to any disclaimer, the term of this patent is extended or adjusted under 35 U.S.C. 154(b) by 330 days.

(21) Appl. No.: 12/828,196

(22) Filed: Jun. 30, 2010

(65) Prior Publication Data

US 2011/0255935 A1 Oct. 20, 2011

(30) Foreign Application Priority Data

Apr. 15, 2010 (TW) ................................ 99111872 A

(51) Int. Cl.
*F16B 35/00* (2006.01)
(52) U.S. Cl.
USPC ............ 411/107; 411/349; 411/552; 411/999
(58) Field of Classification Search .................. 411/107, 411/172, 349, 549, 552, 553, 999
See application file for complete search history.

(56) References Cited

U.S. PATENT DOCUMENTS

| 1,803,431 | A | * | 5/1931 | Hill ............................... 411/349 |
| 1,809,117 | A | * | 6/1931 | Golden ........................... 16/220 |
| 4,657,462 | A | * | 4/1987 | Hoen ............................ 411/552 |
| 5,154,559 | A | * | 10/1992 | Wagner ........................ 411/107 |
| 6,042,314 | A | * | 3/2000 | Guelck ......................... 411/399 |
| 6,267,543 | B1 | * | 7/2001 | David et al. .................. 411/552 |
| 6,338,649 | B1 | * | 1/2002 | Smith ........................... 439/504 |

* cited by examiner

*Primary Examiner* — Flemming Saether
(74) *Attorney, Agent, or Firm* — Altis Law Group, Inc.

(57) ABSTRACT

An exemplary securing structure includes a base, a fastener, and a spring mounted around the fastener. The base defines a securing hole, and two slots located aside the securing hole and communicating with the securing hole. The fastener includes a head, a bolt extending downwardly from the head, and two blocks extending outwardly from an outer periphery of the bolt corresponding to the slots. The bolt is extendable through the securing hole together with the blocks extending through the slots, respectively. The fastener is then rotatable to a position such that the blocks abuts a bottom side of the base. The spring is resiliently compressed between the head of the fastener and a top side of the base.

10 Claims, 5 Drawing Sheets

SECURING STRUCTURE WITH URGED FASTENER

BACKGROUND

1. Technical Field

The present disclosure relates to securing structures, and particularly to a securing structure that is easily pre-assembled.

2. Description of Related Art

In the field of computers, for example, thermal modules are mounted on electronic components for dissipating heat therefrom. Often, several mounting elements are needed for securing a thermal module onto a circuit board, so that the thermal module can contact an electronic component mounted on the circuit board. The mounting elements are pre-assembled on the thermal module, before the thermal module is transported to another location to be connected with the circuit board. Generally, each mounting element includes a bolt defining an annular groove near a bottom thereof, a spring disposed around a top of the bolt, and a ring-like clipping member. In the pre-assembling process, after the bolt extends through the thermal module, the clipping member is expanded radially and outwardly to snap in the groove of the bolt. Thereby, the bolt is pre-assembled to the thermal module.

However, during the pre-assembling process, there is no mechanism provided in the bolt which can reliably ensure the snapping of the clipping member into the groove of the bolt. If the clipping member is not properly and firmly snapped in the groove of the bolt, the clipping member is liable to drop from the bolt during transportation of the pre-assembled thermal module. In addition, after the thermal module is assembled to the electronic component, the clipping members are no longer needed. As the clipping members are made of metal, a cost of the thermal module is increased by the need for the clipping members.

Thus, it is desirable to overcome the described limitations.

DETAILED DESCRIPTION

Figure 1:
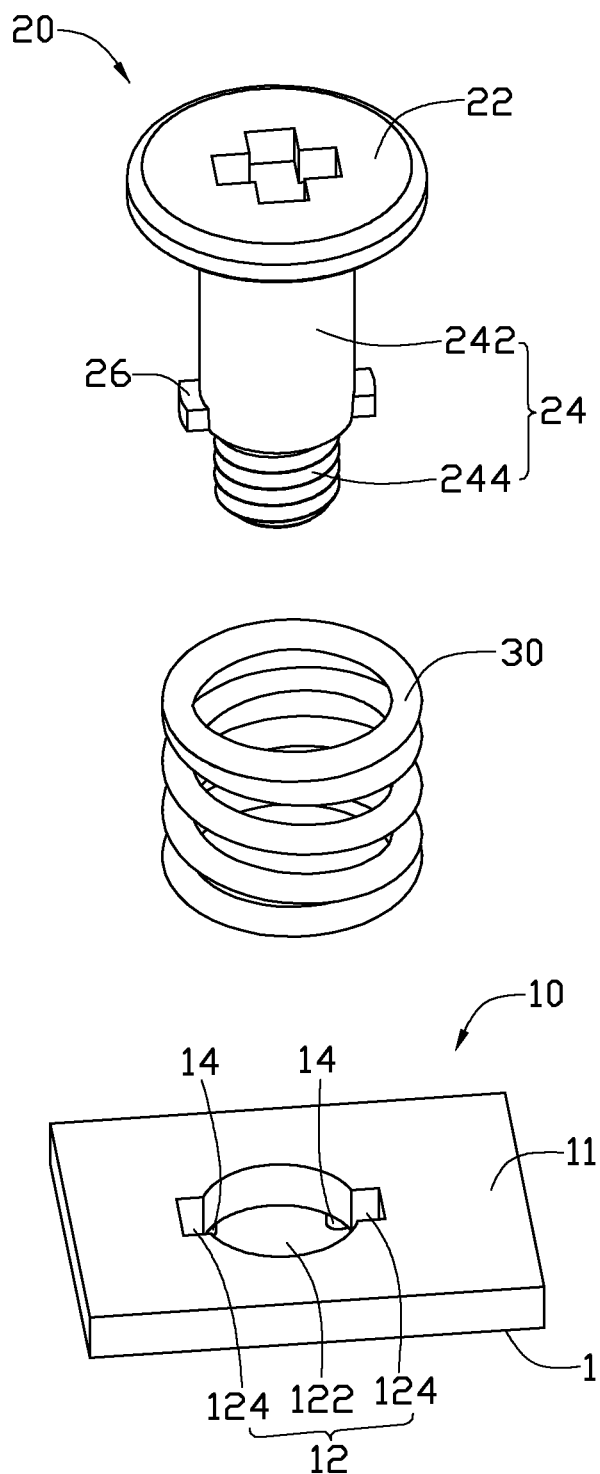
FIG. 1 is an exploded, isometric view of a securing structure in accordance with an exemplary embodiment.
Figure 2:
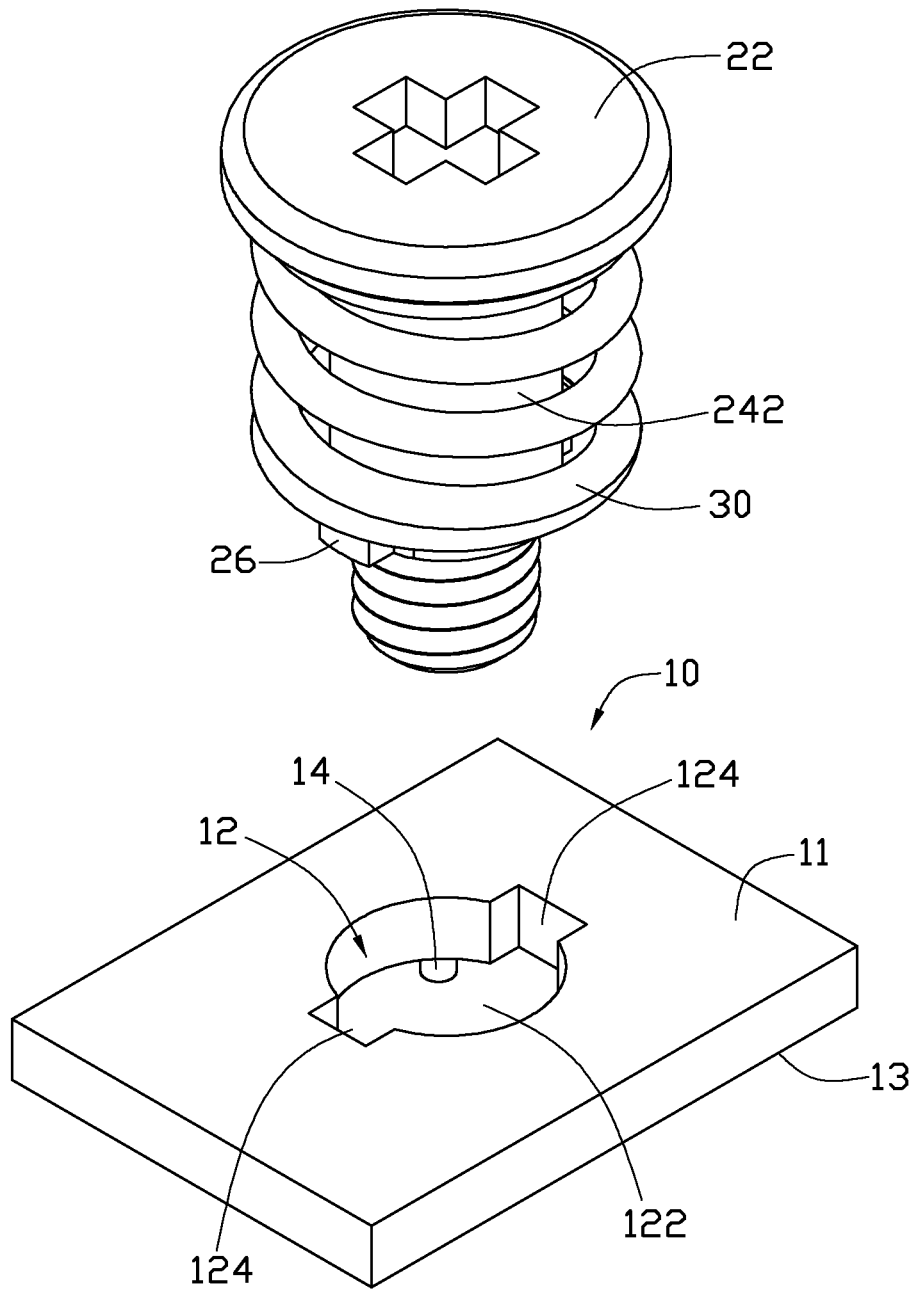
FIG. 2 is a partially assembled view of the securing structure of FIG. 1.
Figure 3:
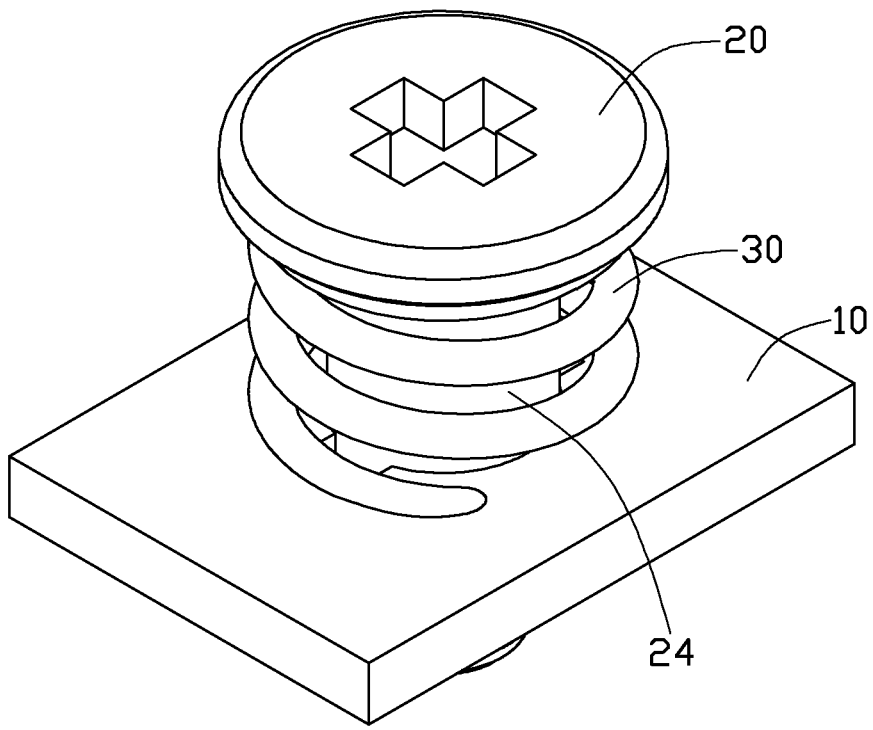
FIG. 3 is a completely assembled view of the securing structure of FIG. 2, showing a fastener of the securing structure mounted to a base of the securing structure.

Referring to FIGS. 1-3, an exemplary securing structure includes a base 10, a fastener 20, and a spring 30 mounted around the fastener 20. The base 10 is to be mounted to another component by the fastener 20. The base 10 may be part of a substrate of a heat sink which is to be mounted to a circuit board to contact a heat generating electronic component located on the circuit board.

The base 10 is rectangular, with a through mounting hole 12 defined therein. The mounting hole 12 includes a circular hole 122 at a center, and two slots 124 symmetrically located at two opposite sides of the circular hole 122. Each of the slots 124 is rectangular shaped, and communicates with the circular hole 122. A width of each slot 124 is far less than a diameter of the circular hole 122.

Figure 4:
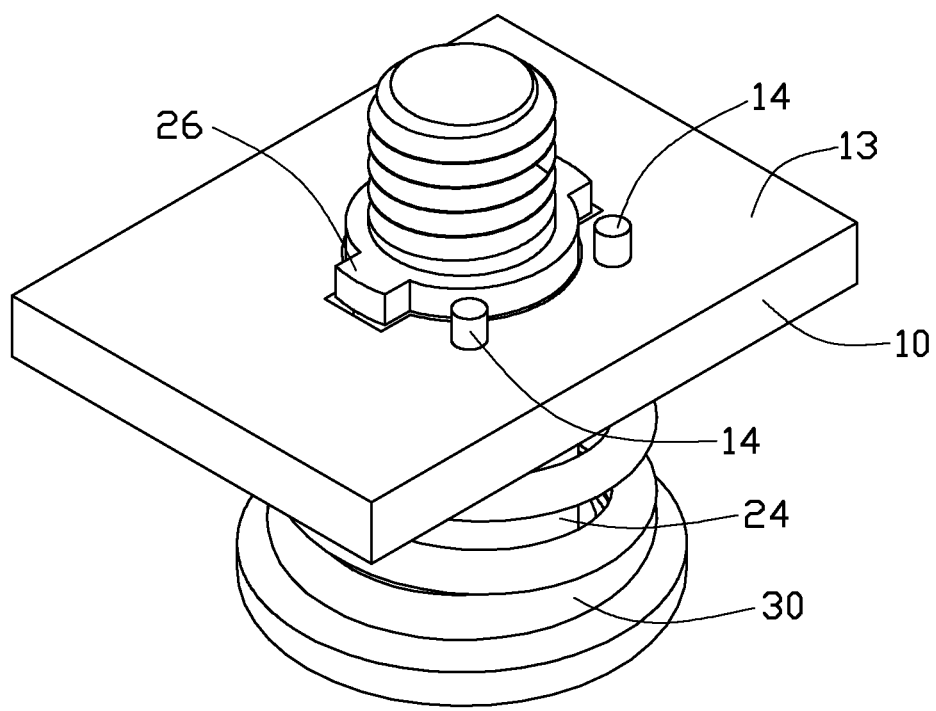
FIG. 4 is essentially an inverted view of the assembly of FIG. 3, showing the fastener in a preliminary position in the process of being mounted to the base of the securing structure.

Referring also to FIG. 4, the base 10 includes a bottom surface 13, and two poles 14 extending downwardly and perpendicularly from the bottom surface 13. The poles 14 are spaced from each other, and located adjacent to a circumference of the mounting hole 12 of the base 10. The poles 14 are arranged at a same side of the mounting hole 12. More specifically, the poles 14 are both located between the two slots 124 along a circumferential direction of the mounting hole 12.

The fastener 20 includes a head 22, a bolt 24 extending downwardly from the head 22, and two blocks 26 extending perpendicularly and outwardly from an outer periphery of the bolt 24. The bolt 24 is column-shaped, and has a diameter less than that of the spring 30. The outer diameter of the spring 30 is less than that of the head 22. The bolt 24 includes a fixed end section 242 adjacent to the head 22, and a free end section 244 far away from the head 22. A thread is defined at an outer periphery of the free end section 244 of the bolt 24. The free end section 244 of the bolt 24 is configured for engaging with a securing hole of the other component, to fix the base 10 onto the other component.

The blocks 26 have the same shape and size. Each of the blocks 26 is in the form of a tab. The blocks 26 are symmetrically arranged at two opposite sides of a lower end of the fixed end section 242 above the free end section 244 of the bolt 24. The bolt 24 has a diameter slightly less than that of the circular hole 122 of the base 10, and the size of each of the blocks 26 is substantially equal to that of each of the slots 124. Thus, the bolt 24 with the blocks 26 is able to extend through the mounting hole 12 of the base 10. The outer diameter of the spring 30 is larger than that of the circular hole 122, and thus after the free end section 244 of the bolt 24 is extended through the mounting hole 12, the spring 30 is compressed between a top surface 11 of the base 10 and the underside of the head 22.

Figure 5:
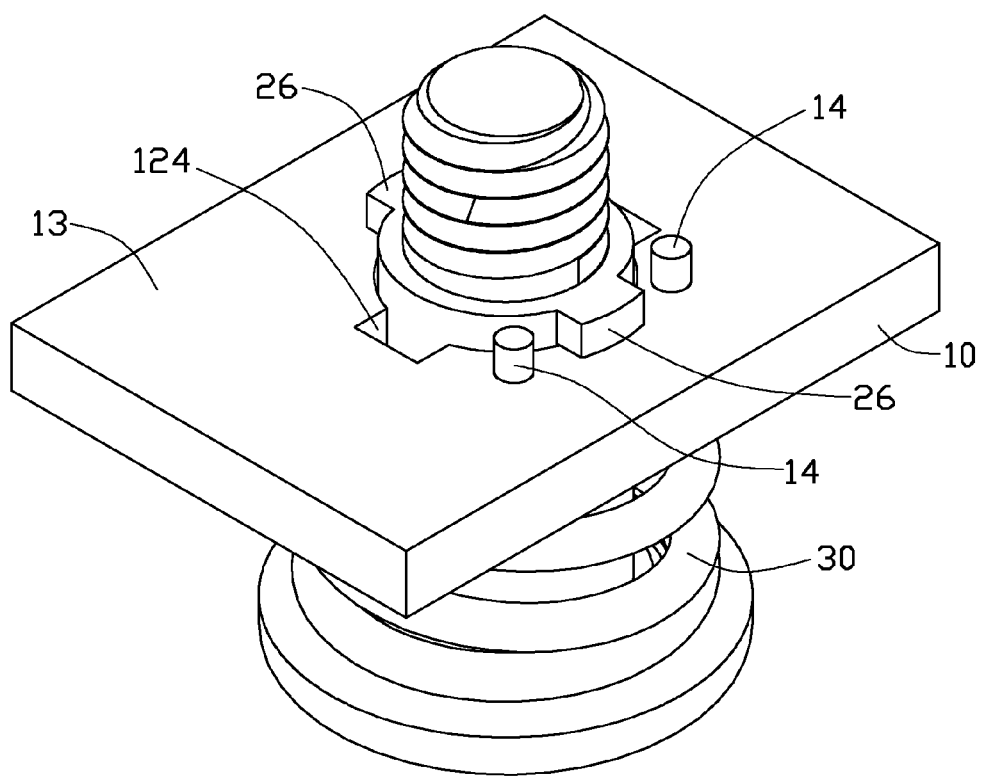
FIG. 5 is similar to FIG. 4, but showing the fastener in a final position in which it has been pre-assembled to the base of the securing structure.

In assembly, the spring 30 is positioned around the bolt 24 of the fastener 20, and then the spring 30 is resiliently compressed towards the head 22 to expose a lower part of the fixed end section 242 of the bolt 24. The fastener 20 is aligned with the mounting hole 12, with the free end section 244 of the bolt 24 aligned with the circular hole 122 of the mounting hole 12, and the blocks 26 aligned with the slots 124 of the mounting hole 12. Referring to FIGS. 4 and 5, the bolt 24 with the blocks 26 is pressed downwardly by an operator and extends through the mounting hole 12 till the blocks 26 are located below the bottom surface 13 of the base 10, and a space between the blocks 26 and the bottom surface 13 of the base 10 is slightly larger than a height of each of the poles 14. Then, the fastener 20 is rotated an angle, typically about 90°, to cause one block 26 to be located generally between the poles 14. At that time, top and bottom ends of the spring 30 respectively abut the head 22 and the top surface 11 of the base 10, with the spring 30 resiliently compressed between the head 22 of the fastener 20 and the top surface 11 of the base 10. Then, the operator releases the pressure on the bolt 24, and the compressed spring 30 rebounds. Thus, under the urging of the elastic force applied by the compressed spring 30, the blocks 26 constantly abut against the bottom surface 13 of the base 10. Accordingly, vertical movement of the fastener 20 is limited.

In addition, one of the blocks 26 is located between the two poles 14, and the distance between each pole 14 and the nearest point of the circumference of the mounting hole 12 is shorter than the length of the block 26. Therefore rotational movement of the fastener 20 along circumferential directions of the mounting hole 12 is limited by the poles 14. Accordingly, the blocks 26 are kept from moving towards the slots 124 whereat they may escape from the mounting hole 12 of the base 10. Thus, the fastener 20 is pre-assembled to the base 10 reliably, and cannot be easily displaced from the pre-assembled position even during transportation.

In the above-described securing structure, the clipping members of the conventional art (see above) are not necessary. The fastener 20 has a simple structure and accordingly a low cost. Since assembly of the clipping member to the bolts is not needed, the fastener 20 can be pre-assembled to the base 10 directly and more quickly. In addition, the fastener 20 can be inexpensive.

It is to be understood, however, that even though numerous characteristics and advantages of the exemplary embodiment(s) have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A securing structure, comprising:
    a base defining a securing hole and at least one slot, the at least one slot located aside the securing hole and communicating with the securing hole;
    a fastener comprising a head, a bolt extending downwardly from the head, and at least one block extending outwardly from an outer periphery of the bolt, the at least one block corresponding to the at least one slot; and
    a spring mounted around the bolt of the fastener,
        wherein the bolt is extendable through the securing hole together with the at least one block extending through the at least one slot, and the fastener is then rotatable to a position such that the at least one block abuts a bottom side of the base and the spring is resiliently compressed between the head of the fastener and a top side of the base; and
        wherein the bolt comprises a fixed end section adjacent to the head and as free end section far away from the head, the free end section is formed with a thread at an outer periphery thereof, and the at least one block is located at the fixed end section above the free end section.

2. The securing structure of claim 1, wherein the bolt of the fastener is column-shaped, and the securing hole of the base is circular.

3. The securing structure of claim 1, wherein the at least one slot comprises two slots, and the at least one block comprises two blocks corresponding to the two slots, respectively.

4. The securing structure of claim 3, wherein the base comprises two poles extending downwardly from the bottom side thereof and located adjacent to a circumference of the securing hole, one of the blocks is located between the two poles along a circumferential direction of the securing hole, and the two poles thereby limit rotation of the fastener along circumferential directions of the securing hole to prevent the blocks from moving to the slots.

5. The securing structure of claim 3, wherein the two slots are symmetrically located at two opposite sides of the securing hole, and the two blocks are symmetrically located at two opposite sides of the bolt.

6. The securing structure of claim 5, wherein the base comprises two poles extending downwardly from the bottom side thereof and located adjacent to a circumference of the securing hole, one of the blocks is located between the two poles along a circumferential direction of the securing hole, and the two poles thereby limit rotation of the fastener along circumferential directions of the securing hole to prevent the blocks from moving to the slots.

7. The securing structure of claim 1, wherein the at least one block is in the form of a tab.

8. The securing structure of claim 1, wherein the at least one block extends perpendicularly outwardly from the outer periphery of the bolt.

9. The securing structure of claim 1, wherein the base comprises two poles extending downwardly from the bottom side thereof and located adjacent to a circumference of the securing hole, the at least one block is located between the two poles along a circumferential direction of the securing hole, and the two poles thereby limit rotation of the fastener along circumferential directions of the securing hole to prevent the at least one block from moving to the at least one slot.

10. A securing device, comprising:
    a base portion comprising two poles extending downwardly from a bottom side thereof, a securing hole, and a slot, the slot communicating with the securing hole, and the poles located adjacent to the securing hole;
    a fastener comprising a head, a bolt extending downwardly from the head, and a block extending outwardly from the bolt, the block corresponding to the slot; and
    a spring mounted around the bolt of the fastener,
        wherein when the bolt is pressed to extend through the securing hole together with the block extending through the slot, the spring is resiliently compressed between the head of the fastener and a top side of the base portion; and when the fastener is then rotated to a position where the block is located generally between the poles and the pressure on the bolt is released, the spring rebounds and the block abuts the bottom side of the base portion and the spring is still resiliently compressed between the head of the fastener and the top side of the base portion; and
        wherein the bolt comprises a fixed end section adjacent to the head and a free end section far away from the head, the free end section is formed with a thread at an outer periphery thereof, and the block is located at the fixed end section above the free end section.

* * * * *